(12) United States Patent
Jacobson et al.

(10) Patent No.: US 6,720,531 B1
(45) Date of Patent: Apr. 13, 2004

(54) LIGHT SCATTERING PROCESS CHAMBER WALLS

(75) Inventors: Paul T. Jacobson, Phoenix, AZ (US); Ivo Raaijmakers, Bilthoven (NL)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/317,267

(22) Filed: Dec. 11, 2002

(51) Int. Cl.[7] .................................................. F27B 5/14
(52) U.S. Cl. .................. 219/390; 219/405; 219/411; 118/724; 118/725; 118/50.1; 392/416; 392/418
(58) Field of Search ................................. 219/390, 405, 219/411; 392/416, 418; 118/724, 725, 50.1

(56) References Cited

U.S. PATENT DOCUMENTS

| | | | |
|---|---|---|---|
| 4,101,759 A | * | 7/1978 | Anthony et al. ............ 219/343 |
| 4,382,776 A | | 5/1983 | Kawase et al. |
| 4,500,642 A | | 2/1985 | Reiji et al. |
| 4,550,684 A | | 11/1985 | Mahawili |
| 4,828,224 A | | 5/1989 | Crabb et al. |
| 4,836,138 A | | 6/1989 | Robinson et al. |
| 5,308,446 A | | 5/1994 | Bihuniak et al. |
| 5,399,523 A | | 3/1995 | Kakoschke |
| 5,452,396 A | | 9/1995 | Sopori |
| 5,532,457 A | | 7/1996 | Cobb et al. |
| 5,561,735 A | | 10/1996 | Camm |
| 5,569,979 A | | 10/1996 | Scott et al. |
| 5,572,091 A | | 11/1996 | Langer et al. |
| 5,584,934 A | | 12/1996 | Lin |
| 5,790,736 A | | 8/1998 | Fabian |
| 5,960,158 A | | 9/1999 | Gat et al. |
| 5,991,508 A | | 11/1999 | Ohmine et al. |
| 6,021,152 A | | 2/2000 | Olsen et al. |
| 6,084,213 A | | 7/2000 | Kohav et al. |
| 6,121,580 A | * | 9/2000 | Tsukamoto .................. 219/390 |
| 6,150,006 A | | 11/2000 | Hellmann et al. |

* cited by examiner

*Primary Examiner*—Shawntina Fuqua
(74) *Attorney, Agent, or Firm*—Knobbe, Martens, Olson & Bear LLP

(57) ABSTRACT

A semiconductor processing apparatus having a processing chamber defined by a plurality of walls and a substrate support to support a substrate within the processing chamber.

11 Claims, 1 Drawing Sheet

LIGHT SCATTERING PROCESS CHAMBER WALLS

FIELD OF THE INVENTION

The present invention relates to temperature control of semiconductor substrates during processing and, more particularly, to cold-wall reactors and methods for achieving better temperature uniformity during high temperature processing.

BACKGROUND OF THE INVENTION

Chemical vapor deposition (CVD) is a well known process in the semiconductor industry for forming thin films of materials on substrates, such as silicon wafers. In a CVD process, one or more substrates are placed on a wafer support inside a chamber that forms part of a reactor (i.e., within a reaction chamber of the reactor), and gaseous precursors of the material to be deposited on the substrates are supplied to the substrates to form a thin film of the material by chemical reaction. Typically, CVD processes are conducted at elevated temperatures (e.g., greater than 500° C.) to accelerate the chemical reaction and to produce high quality films. Through subsequent processes, these layers are used to form integrated circuits.

Various process parameters must be carefully controlled to ensure the high quality of the layers. One such critical parameter is the temperature of the wafer during each process step.

Substrates can be heated using various techniques, including resistance heating, induction heating and radiant heating. Among these, radiant heating is the most efficient technique for temperature cycling and, thus, is the currently favored method for high temperature processes. Radiant heating involves positioning lamps within high-temperature reactors. Unfortunately, radiant energy has a tendency to create non-uniform temperature distributions, or "hot spots," in the wafer due to the use of localized sources and the consequent focusing and interference effects.

If the temperature varies across the surface of the wafer, material deposition can occur unevenly across the wafer, and the thickness of the deposited layers will not be uniform. Similarly, non-uniformity or instability of temperature across a wafer during other thermal treatments can affect the uniformity of resulting structures. There are many other processes for which temperature control is critical, including oxidation, nitridation, dopant diffusion, sputter depositions, photolithography, dry etching, plasma processes, and high temperature anneals.

To overcome the aforementioned problems, reactors have been constructed in which the wafer is rotated during processing. Such reactors may include a circular rotatable support structure, upon which the wafer is situated. The support structure rotates the wafer about its central axis to reduce the temperature non-uniformity across the wafer.

The lamps within the reactor can also be positioned in a manner that will facilitate controlling the temperature in various locations within the reaction chamber. For instance, in some configurations, the lamps generally are linear in design and are arranged in a pair of crossing arrays. The grid resulting from the crossing array configuration facilitates some control over the temperature uniformity of the wafer by allowing adjustment of the power that is delivered to a particular lamp or group of lamps.

Unfortunately, the configuration of the radiant heating lamps may present further temperature non-uniformity problems. For example, the radiant heating patterns generated by the lamps may closely resemble the pattern or position of the lamps within or around the chamber. Furthermore, heat may be reflected off of or re-radiated from the surface of the wafer and the walls of the chamber in a consistent pattern, thus creating concentrated regions of radiation and resulting in non-uniform heating of the wafer.

In an effort to provide a more uniform temperature distribution across the wafer, reflectors have been mounted behind the lamps to indirectly illuminate the wafer. The reflectors can be roughened to diffuse the radiation redirected by the reflectors towards the substrate. The radiation reflected onto the wafer surface is thus made more uniform. U.S. Pat. No. 6,021,152, for example, discloses a system for achieving a more random reflection of radiation from the reflector surface.

Despite improvements in temperature control and reflector technology, radiant heating systems can still produce non-uniform temperatures across wafers being processed. Accordingly, a need exists for a system that achieves more uniform temperatures across semiconductor wafers during processing. Desirably, such a system should be a radiant heating system to maintain the advantages of radiant heating.

SUMMARY OF THE INVENTION

In accordance with one aspect of the present invention, a semiconductor processing apparatus is provided, comprising a processing chamber defined by a plurality of walls and a substrate support to support a substrate within the processing chamber. A plurality of radiant heating lamps are positioned outside the processing chamber to heat the substrate through the walls when the substrate is supported on the substrate support. A diffuser is provided between at least one wall of the processing chamber and the substrate when the substrate is supported within the processing chamber. In one embodiment, the diffuser is formed on an inner surface of the at least one wall. The diffuser diffuses radiation incident on the at least one wall of from the substrate.

In accordance with another aspect of the present invention, a method of uniformly heating a substrate is provided. The method comprises positioning the substrate within a processing chamber defined by a plurality of walls. A diffuser is formed on an inner surface of at least one of the walls. The substrate is radiated through the at least one wall to heat the substrate. The diffuser diffuses radiation incident on the at least one wall from the substrate.

DETAILED DESCRIPTION OF THE PREFERRED EMBODIMENT

Figure 1:
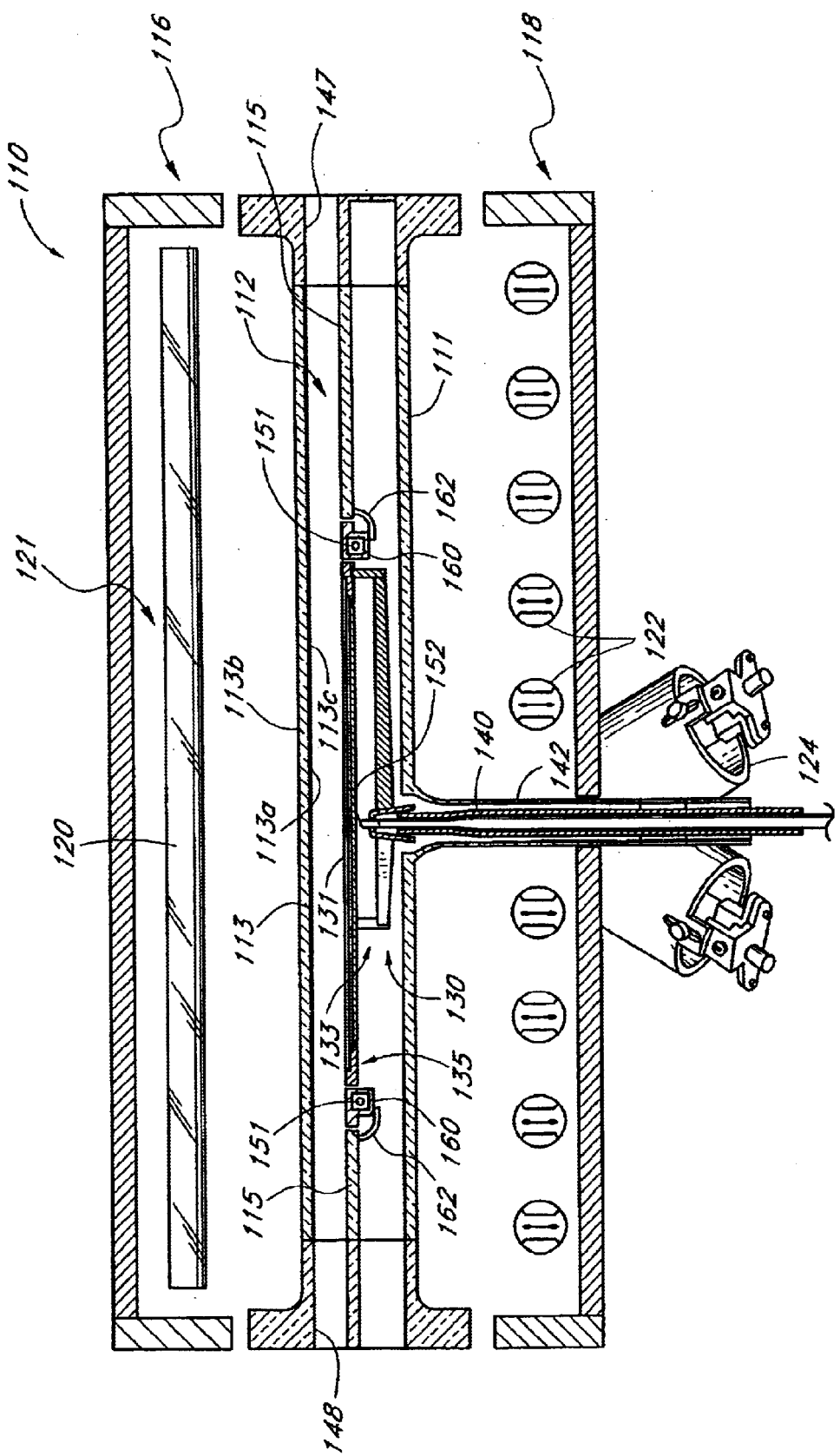
FIG. 1 is a schematic sectional view of an exemplary single-substrate reactor constructed in accordance with one embodiment of the present invention, with a substrate supported within the reactor.

FIG. 1 illustrates an exemplary chemical vapor deposition (CVD) reactor 110, including a reaction chamber 112 of the horizontal-flow type. The reaction chamber 112 is defined, in part, by a transparent lower wall 111 and a transparent upper wall 113, both comprising quartz in the illustrated embodiment. A radiant heat source 121 is provided within the reactor 110 outside the chamber 112 to provide heat energy to the chamber 112. In the illustrated embodiment, the radiant heat source 121 comprises an upper heating assembly 116 and a lower heating assembly 118. The upper heating assembly 116 comprises a plurality of elongated tube-type radiant heating lamps 120. The heating lamps 120 of the upper heating assembly 116 are preferably spaced-apart and disposed substantially parallel to the reactant gas flow path through the underlying reaction chamber 112. The lower heating assembly 118 similarly comprises a plurality of elongated tube-type radiant heating lamps 122 arranged below the reaction chamber 112 and preferably oriented transversely to the heating lamps 120 of the upper heating assembly 116. A number of spot lamps 124 desirably are provided below the reaction chamber 112 to focus radiant heat on the underside of a wafer or substrate 131 located within the reaction chamber 112. The spot lamps 124 serve to counteract any heat-sink effect created by the massive structures extending through the bottom of the reactor 110.

In the exemplary reactor 110 of FIG. 1, the upper heating assembly 116 comprises nine upper heating lamps 120, each of about 6 kW maximum power. The lower heating assembly 118 similarly comprises nine lower heating lamps 122, each of about 6 kW maximum power. Four spot lamps 124, each of about 1 kW maximum power, are provided below the reaction chamber 112. Accordingly, the maximum power of the illustrated exemplary single wafer processing reactor 110 is about 112 kW. It will be understood, however, that the reactor 110 may have a greater or lesser power capacity depending on the size of the substrates to be processed in the reactor 110. More generally, the reactor 110 preferably has a power capacity between about 20 kW and 150 kW for processing 200 mm substrates, and between about 50 kW and 300 kW for processing 300 mm substrates. A batch processor would generally have a much greater capacity for heating a number of substrates simultaneously.

The upper and lower heating lamps 120, 122 are preferably high intensity tungsten filament lamps, each comprising a transparent quartz envelope containing a halogen gas such as iodine. Such lamps produce full-spectrum radiant heat energy that is transmitted through the walls 111, 113 of the reaction chamber 112 without appreciable absorption. As is known in the art of semiconductor processing equipment, the power of the various lamps 120, 122 can be controlled independently or in grouped zones, as is well known in the art.

Reflectors (not shown) may be provided above the upper heating lamps 120 and/or below the lower heating lamps 122 to help focus radiant energy towards the substrate 131. The reflectors may comprise curved reflective surfaces which may, for example, be etched to diffusively reflect the radiation emitted from the heating lamps 120, 122 towards the substrate 131. The reflectors may be adjacent all of the heating lamps 120, 122, or only certain of the heating lamps 120, 122, such as the peripheral heating lamps 120, 122, to compensate for the increased heat loss of the substrate 131 at the substrate 131 edge.

As illustrated in FIG. 1, a substrate 131 is supported within the reaction chamber 112 on a substrate support 130. In the embodiment illustrated, the support 130 comprises a support spider 133 and a radiation-absorbing susceptor 135 upon which the substrate 131 is situated. The spider 133 is mounted to a rotatable shaft 140 that extends downwardly through a tube 142 depending from the chamber 112. The support 130 is preferably rotated during processing of the substrate to improve temperature uniformity across the substrate 131.

In the exemplary reactor 110 of FIG. 1, a divider 115 is provided between the upper wall 113 and the lower wall 111.

In some arrangements, the divider 115 is only provided upstream of the substrate support 130, and upper and lower spaces are open to open another in the region downstream of the substrate support 130. An outlet port 147 and an inlet port 148 are provided at the sides of the reaction chamber 112, defining a gas flow path over the substrate support 130. Thus, the chamber 112 is described as a single pass, horizontal flow CVD chamber. Reference is made to U.S. Pat. No. 4,836,138, issued Jun. 6, 1989, and U.S. Pat. No. 4,828,224, issued May 9, 1989, both of which are hereby incorporated by reference, which provide background information regarding cold-wall, single wafer CVD reactors.

A number of temperature sensors 151, 152 are positioned in proximity to the substrate 131 to monitor the temperature across the substrate 131. The temperature sensors 150 may be of a variety of different types, including optical pyrometers and thermocouples. Preferably, the temperature sensors 151, 152 are provided at various locations near the substrate 131 to allow the temperature uniformity of the substrate 131 to be monitored.

In the illustrated embodiment, the temperature sensors 151, 152 comprise thermocouples. A first or central thermocouple 152 is suspended below substrate support 130 in a suitable fashion. The illustrated central thermocouple 152 passes through the spider 133 in proximity to the susceptor 135. A plurality of secondary or peripheral thermocouples 151 are also provided near the substrate 131. The peripheral thermocouples 151 are preferably housed within a slip ring 160, which surrounds the substrate support 130 and the substrate 131. The slip ring 160 can be suspended in the chamber 112 by any suitable means. For example, in the illustrated embodiment, the slip ring 160 rests on elbows 162, which depend from the divider 115. As is known, the thermocouples 151, 152 directly supply a voltage to a controller (not shown) as an indicator of temperature. The controller adjusts the power of the various heating lamps 120, 122 in response to the voltage outputs of the thermocouples 151, 152.

In addition to housing the peripheral thermocouples 151, the slip ring 160 absorbs and radiates heat during processing of the substrate 131, thereby reducing the heat loss at the edge of the substrate 131. This compensates for the greater heat loss of the substrate 131 near the edge of the substrate 131, a phenomenon which is known to occur due to a greater ratio of surface area to volume near the edge of the substrate 131. By minimizing heat loss at the edge of the substrate 131, the slip ring 160 can reduce the risk of crystallographic slip.

As illustrated in FIG. 1, the upper wall 113 of the chamber 112 has an inner surface 113a and an outer surface 113b. In the embodiment shown, a diffuser 113c is provided on the inner surface 113a of the upper wall 113. The diffuser 113c can be formed, for example, by chemically etching, mechanically grinding, sandblasting or bead-blasting the inner surface 113a of the upper wall 113 to roughen, or stipple, the inner surface 113a. The diffuser 113c can be provided over substantially the entire inner surface 113a, or only over selected portions of the inner surface 113a to form a desired pattern thereon. Additionally, the diffuser 113c can comprise a surface that is more or less roughened in certain selected areas. Preferably, the diffuser 113c comprises a surface having a random average surface roughness of about 1 $\mu$m to 100 $\mu$m, and more preferably about 2 $\mu$m to 50 $\mu$m.

The walls 111, 113 of the chamber 112 preferably comprise a material that can be readily etched or roughened, such as quartz or silicon carbide. In the illustrated embodiment, the walls 111, 113 are transparent quartz.

One preferred technique for forming the diffuser 113c comprises etching the inner surface 113a of the upper wall 113 using a wet etching process, such as that described in U.S. Pat. No. 6,150,006, issued Nov. 21, 2000, which is hereby incorporated by reference. As described in U.S. Pat. No. 6,150,006, an etching solution is prepared, including, by weight, 23.6% HF (added as a 50% solution), 17.4% ammonium fluoride (added as a solid), 35.4% acetic acid (added as 100% pure acetic acid) and 23.6% water. The surface to be etched is brought into contact with the solution for 60 minutes at a temperature of 15° C. The surface is then cleaned for 10 minutes in a 5% HF solution. The resulting surface has an average roughness of about 2 μm.

In another preferred embodiment, the upper wall 113 of the chamber 112 comprises SST (Special Surface Treatment) quartz, which is available from Heraeus Quarzglas of Germany. This known type of quartzware is produced using a wet etch chemistry consisting of HF and organic acids. The resultant texture is similar to that of an orange peel.

In operation, as the temperature of the substrate 131 increases, the substrate 131 begins to glow and radiate energy. In addition, some of the radiation incident on the substrate 131 is reflected by the substrate 131. In conventional reactors, the energy radiated by, or reflected off of, the substrate 131 is then reflected off the inner surfaces of the reaction chamber 112 and back onto the substrate 131, causing temperature variations in the substrate 131. In the reactor of the illustrated embodiment, however, the diffuser 113c provided on the inner surface 113a of the upper wall 113 of the reaction chamber 112 serves to diffuse, or scatter, the energy radiated by, or reflected off of, the substrate 131. This disrupts the pattern of radiation from the substrate 131 itself that is reflected by the upper wall 113 back to the substrate 131. The temperature pattern of the substrate 131 is thus less affected by the energy radiated by or reflected off of the substrate 131 and re-reflected by the chamber 112 walls, allowing greater control and uniformity of the substrate 131 temperature. Furthermore, less radiation is reflected back to the substrate 131, speeding the cooling of the substrate 131 after processing.

One type of process in which the reactor 110 of the illustrated embodiment can advantageously be employed is epitaxial deposition. As is known in the art, epitaxial deposition is a type of CVD process whereby the deposited layer grows in conformity with the crystal structure of the underlying layer. Temperature ranges and deposition rates depend in general upon the source gas used and other reactor conditions. In general, epitaxy is effected by silane ($SiH_4$) between about 600° C. and 1000° C., by dichlorosilane (DCS or $SiH_2Cl_2$) between about 700° C. and 1100° C., or by trichlorosilane (TCS or $SiHCl_3$) between about 1050° C. and 1150° C. More recently, lower temperature epitaxy has gained favor.

An exemplary high temperature epitaxial deposition process comprises forming about 3 μm of epitaxial silicon on a substrate by flowing 15 grams per minute of TCS in a 45 slm flow of $H_2$ carrier for about 45 seconds, with the substrate temperature at about 1120° C. A dopant gas can also be added to the flow to achieve a background dopant level for devices to be formed in the layer in subsequent processing steps. Reactant gases are shut off when a layer of sufficient thickness has been formed.

In an exemplary low temperature epitaxial deposition process, about 0.04 μm of epitaxial silicon is formed on a substrate by flowing 20 sccm of dichlorosilane in a 20 slm flow of hydrogen carrier for about 600 seconds, with the substrate temperature at about 700° C. See Rapid Thermal Processing (RTP) 1997, 5th International Conference on Advanced Thermal Processing of Semiconductors, New Orleans, Sep. 3–5, 1997. As in the high temperature epitaxial deposition process, a dopant gas can be added to the flow to achieve a background dopant level for devices to be formed in the layer in subsequent processing steps. Reactant gases are shut off when a layer of sufficient thickness has been formed.

The elevated temperatures common in CVD processes tend to exacerbate the problems associated with radiation emitted or reflected by the hot substrate and reflected back to the substrate by the chamber walls. Accordingly, the reactor 110 of the illustrated embodiment, which diffuses the radiation emitted or reflected by the substrate 131, is particularly well-suited for CVD processes, particularly for processing temperatures greater than about 400° C., more particularly for processing temperatures between about 600° C. and 1150° C., such as the epitaxial processes described hereinabove. Those skilled in the art will recognize, however, that certain aspects and features of the present invention are applicable to other types of processes in which temperature uniformity of the substrate is similarly important.

Although the present invention has been described in terms of certain embodiments other embodiments apparent to those of ordinary skill in the art also are within the of this invention. Thus, various changes and modifications may be made without departing from the spirit and scope of the invention. For instance, various components may be repositioned as desired. Moreover, not all of the features, aspects and advantages described herein are necessarily required to practice the present invention.

We claim:

1. A semiconductor processing apparatus, comprising:
   a processing chamber defined by a plurality of walls;
   a substrate support to support a substrate within said processing chamber;
   a plurality of radiant heating lamps positioned outside said processing chamber to heat said substrate through said walls when said substrate is supported on said support; and
   a diffuser provided between at least one wall of processing chamber and said substrate when said substrate is supported within said processing chamber, said diffuser diffusing radiation incident on said at least one wall from said substrate, wherein said diffuser is formed on an inner surface of said at least one wall.

2. The apparatus of claim 1, wherein said diffuser comprises a roughened surface of said at least one wall.

3. The apparatus of claim 2, wherein said at least one wall comprises quartz.

4. The apparatus of claim 3, wherein said roughened surface is produced by an etching process.

5. A semiconductor processing apparatus of, comprising:
   a processing chamber defined by a plurality of walls;
   a substrate support to support a substrate within said processing chamber;
   a plurality of radiant heating lamps positioned outside said processing chamber to heat said substrate through said walls when said substrate is supported on said substrate support; and
   a diffuser provided between at least one wall of said processing chamber and said substrate when said substrate is supported within said processing chamber, said diffuser diffusing radiation incident on said at least one wall of from said substrate, and wherein said diffuser is formed on an inner surface of said at least one wall and said diffuser comprises a roughened surface of said at least one quartz wall, wherein said roughened surface is produced by an etching process and has an average surface roughness of between about 1 μm and 100 μm.

6. The apparatus of claim 4, wherein said roughened surface has an average surface roughness of between about 2 μm and 50 μm.

7. A method of uniformly heating a substrate, comprising:

positioning said substrate within a processing chamber, said processing chamber defined by a plurality of walls and a diffuser formed on an inner surface of at least one of said walls; and radiating said substrate through said at least one wall to heat said substrate, said diffuser diffusing radiation incident on said at least one wall from said substrate.

8. The method of claim 7, further comprising rotating said substrate while radiating heat through said at least one wall.

9. The method of claim 7, wherein said radiating results in heating said substrate to greater than about 400° C.

10. The method of claim 7, wherein said radiating results in heating said substrate to greater than about 600° C.

11. The method of claim 7, wherein said radiating results in heating said substrate to between about 900° C. and 1150° C.

* * * * *

UNITED STATES PATENT AND TRADEMARK OFFICE
CERTIFICATE OF CORRECTION

PATENT NO. : 6,720,531 B1 Page 1 of 1
DATED : April 13, 2004
INVENTOR(S) : Jacobson et al.

It is certified that error appears in the above-identified patent and that said Letters Patent is hereby corrected as shown below:

Column 6,
Line 56, after "apparatus" please delete "of".

Signed and Sealed this

Tenth Day of January, 2006

JON W. DUDAS
*Director of the United States Patent and Trademark Office*